(12) United States Patent
Mathew et al.

(10) Patent No.: US 8,258,035 B2
(45) Date of Patent: Sep. 4, 2012

(54) METHOD TO IMPROVE SOURCE/DRAIN PARASITICS IN VERTICAL DEVICES

(75) Inventors: Leo Mathew, Austin, TX (US); John J. Hackenberg, Austin, TX (US); David C. Sing, Austin, TX (US); Tab A. Stephens, Buda, TX (US); Daniel G. Tekleab, Austin, TX (US); Vishal P. Trivedi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 698 days.

(21) Appl. No.: 11/800,204

(22) Filed: May 4, 2007

(65) Prior Publication Data

US 2008/0274600 A1 Nov. 6, 2008

(51) Int. Cl.
*H01L 21/336* (2006.01)

(52) U.S. Cl. .......... 438/290; 438/300; 438/649

(58) Field of Classification Search .......... 438/283, 438/289, 514, 522, 649, 651, 231, 212, 268, 438/300, 302, 306, 290, 524, 926, FOR. 405, 438/FOR. 410; 257/E21.219, E21.014, E21.619, 257/E21.13, E21.296, E21.593, E21.634
See application file for complete search history.

(56) References Cited

U.S. PATENT DOCUMENTS

| | | | | |
|---|---|---|---|---|
| 5,538,909 A * | 7/1996 | Hsu | ............... | 438/301 |
| 5,640,035 A * | 6/1997 | Sudo et al. | .............. | 257/344 |
| 5,908,313 A * | 6/1999 | Chau et al. | .............. | 438/299 |
| 5,946,571 A * | 8/1999 | Hsue et al. | .............. | 438/255 |
| 6,384,457 B2 * | 5/2002 | Tyagi et al. | .............. | 257/408 |
| 6,844,238 B2 * | 1/2005 | Yeo et al. | .............. | 438/424 |
| 6,914,295 B2 * | 7/2005 | Chau et al. | .............. | 257/333 |
| 6,951,783 B2 | 10/2005 | Mathew | | |
| 6,992,354 B2 | 1/2006 | Nowak et al. | | |
| 7,045,401 B2 * | 5/2006 | Lee et al. | .............. | 438/157 |
| 7,384,838 B2 * | 6/2008 | Hsu et al. | .............. | 438/230 |
| 2002/0019103 A1 * | 2/2002 | Lin et al. | .............. | 438/302 |
| 2002/0171107 A1 | 11/2002 | Cheng et al. | | |
| 2003/0193058 A1 * | 10/2003 | Fried et al. | .............. | 257/200 |
| 2004/0262687 A1 * | 12/2004 | Jung et al. | .............. | 257/347 |
| 2005/0087824 A1 * | 4/2005 | Cabral et al. | .............. | 257/412 |
| 2006/0154410 A1 * | 7/2006 | Choi et al. | .............. | 438/184 |
| 2006/0154423 A1 | 7/2006 | Fried et al. | | |
| 2006/0172476 A1 * | 8/2006 | Liao et al. | .............. | 438/197 |
| 2006/0186484 A1 * | 8/2006 | Chau et al. | .............. | 257/401 |
| 2007/0026615 A1 | 2/2007 | Goktepeli et al. | | |
| 2008/0265321 A1 * | 10/2008 | Yu et al. | .............. | 257/344 |

OTHER PUBLICATIONS

Peters, Laura; "Double Gates Prompt Transistor Revolution"; www.reed-electronics.com/semiconductor/index; Apr. 9, 2007; 6 pages.
Mathew, L. et al.; "Double gate CMOS technology with sub-lithographic (<20nm), 100nm tall, Undoped channel, TiN+ HfxZr1-xO2 gate, Multiple Silicided Source/Drain with Record PMOS Ion/Ioff"; Jan. 11, 2007; 2 pages.

* cited by examiner

*Primary Examiner* — Olik Chaudhuri
*Assistant Examiner* — Quovaunda V Jefferson

(57) ABSTRACT

A method for making a transistor is provided which comprises (a) providing a semiconductor structure having a gate (211) overlying a semiconductor layer (203), and having at least one spacer structure (213) disposed adjacent to said gate; (b) removing a portion of the semiconductor structure adjacent to the spacer structure, thereby exposing a portion (215) of the semiconductor structure which underlies the spacer structure; and (c) subjecting the exposed portion of the semiconductor structure to an angled implant (253, 254).

18 Claims, 10 Drawing Sheets

METHOD TO IMPROVE SOURCE/DRAIN PARASITICS IN VERTICAL DEVICES

FIELD OF THE DISCLOSURE

The present disclosure relates generally to semiconductor fabrication processes, and more particularly to methods for making FinFET devices with improved source/drain parasitics.

BACKGROUND OF THE DISCLOSURE

As the physical dimensions of semiconductor devices continue to decrease, these ever smaller dimensions pose new challenges which must be overcome in order to make the devices functional. In the field of MOSFETs (metallic oxide semiconductor field effect transistors), the decrease in size, and the commensurate decrease in operating current, have resulted in current leakage when the transistor is in its off state. This leakage is often attributed to the formation of parasitic features which are formed in the substrate beneath the gate of the FET. Generally, such parasitic features create alternate and undesirable pathways for current flow. These parasitic features may be caused by imperfections or physical limitations inherent in the fabrication process. In conventional planar CMOS technology wherein FETs are formed on a bulk substrate, parasitic features often form in the channel between the source and drain and beneath the gate at certain depths where the gate field is no longer effective.

One approach known to the art for compensating for the current leakage problem in planar FETs is through the provision of a second gate disposed beneath the channel region. In such dual gate FETs, the second gate provides a lower boundary for the channel, and also provides a second field for regulating the current flow through the channel region.

While dual gate MOSFETs have certain advantages over single gate MOSFETs, they also have some notable drawbacks. In particular, the formation of a lower gate is challenging from a fabrication standpoint, and it is also difficult to properly align the two gates with each other.

The aforementioned difficulties have led to the development of FinFETs, an example of which is depicted in FIGS. 1-2. As seen therein, a FinFET 10 is essentially a dual gate MOSFET in which the gates 46 of the device are formed vertically rather than horizontally, and in which the channel regions 42 are disposed within a series of vertical fins 12 which contain source 14 and drain 18 regions on opposing sides thereof. The FinFET 10 is fabricated from an SOI (semiconductor-on-oxide) wafer 22 which contains an SOI layer 34 disposed on a BOX (buried oxide) layer 26 which, in turn, is disposed on a semiconductor substrate 30. The gate 46, source 14 and drain 18 regions are formed in the SOI layer 34.

After fins 12 have been formed, subsequent processing steps include forming a gate oxide (not shown) on fins 12, and forming the gate 46 which is common to both fins 12. After formation of the gate 46, the source 14 and drain 18 regions are doped, as illustrated by arrows 50, to achieve a doping profile 58. Doping is typically accomplished using ion implantation from the front side of the wafer 22, and typically at an angle of about 30 degrees relative to a normal from the wafer 22 so that ions can enter each fin 12 along its entire height without interference from any adjacent fin 12.

As seen in FIG. 1, FinFET 10 avoids the problem encountered with planar CMOS devices of having to form a second gate beneath the channel of the FET. FinFET 10 also overcomes the problem in planar CMOS technology of having to align gates above and below the channel region. Since the fins 12 in a FinFET device are free-standing structures prior to the formation of the gate 46, the portions of the gate 46 on either side of each channel 42 (see FIG. 2) are largely self-aligned as a result of forming the gate 46 perpendicular to the fins 12.

DETAILED DESCRIPTION

Figure 1:
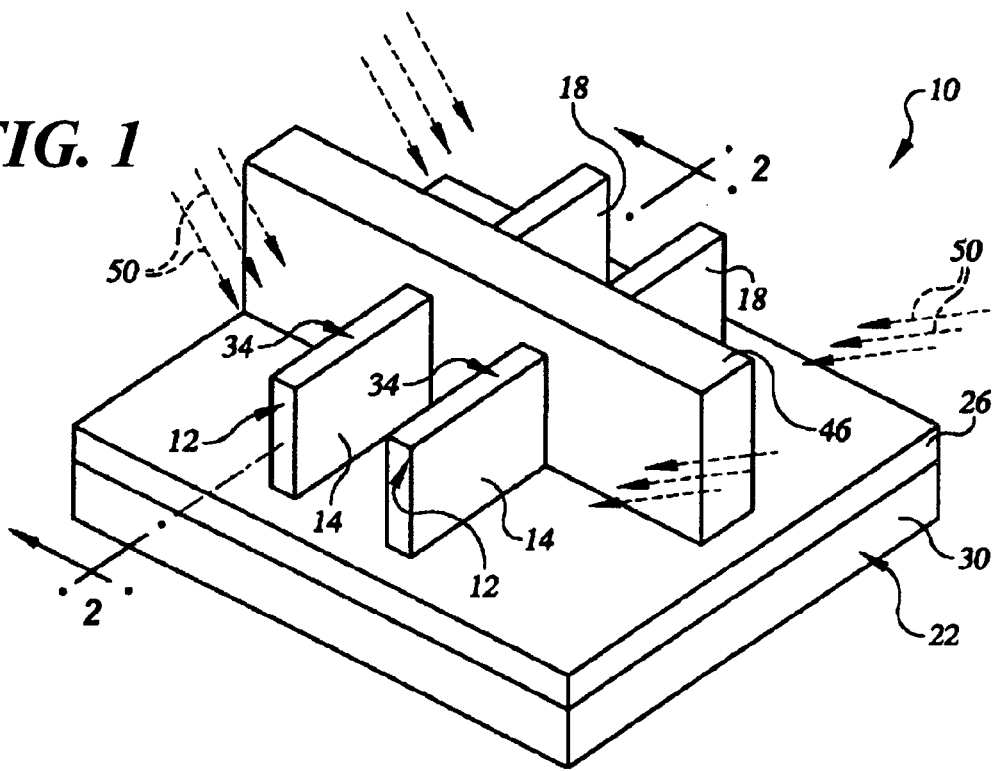
FIG. 1 is an illustration of a prior art FinFET device.
Figure 2:
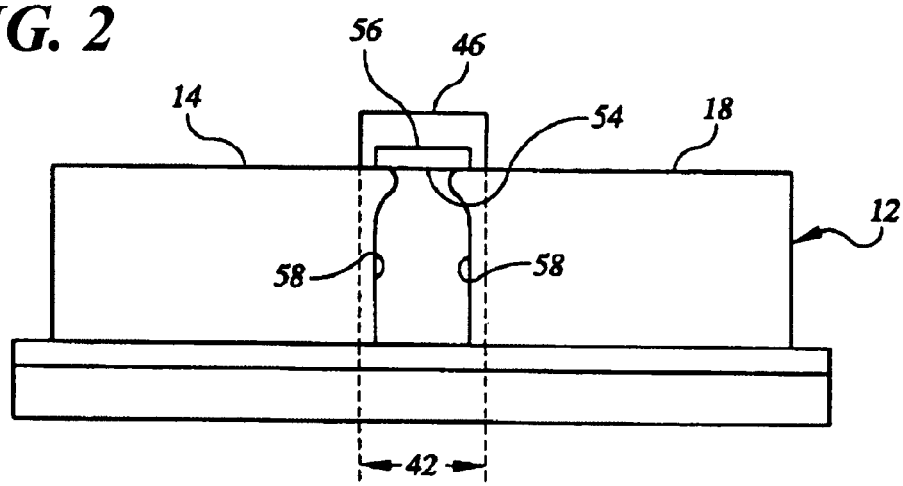
FIG. 2 is a cross-section taken along LINE 2-2 of FIG. 1.

In one aspect, a method for making a transistor is provided which comprises (a) providing a semiconductor structure having a gate overlying a semiconductor layer, and having at least one spacer structure disposed adjacent to said gate; (b) removing a portion of the semiconductor structure adjacent to the spacer structure, thereby exposing a portion of the semiconductor structure which underlies the spacer structure; and (c) subjecting the exposed portion of the semiconductor structure to an angled implant.

In another aspect, a method for making a transistor is provided which comprises (a) providing a semiconductor substrate having a gate defined thereon, and having first and second spacer structures disposed adjacent to said gate; (b) removing a portion of the semiconductor substrate adjacent to each of the first and second spacer structures, thereby creating a mesa in the semiconductor substrate upon which the gate and the first and second spacer structures are disposed; and (c) subjecting a vertical wall of the mesa to an angled implant.

In still another aspect, a method for making a semiconductor device is provided which comprises (a) providing a FinFET structure comprising (a) raised source and drain regions, a fin-shaped channel region extending between the source and drain regions, and (c) a gate extending over the channel region; (b) etching the FinFET structure such that the height of the channel region and the source and drain regions is reduced; and (c) implanting at the source and drain regions at an angle.

Despite the aforementioned advantages of FinFETs, these devices also present certain challenges. In particular, FinFET devices often suffer from significant parasitic series resistance, of which source/drain extension resistance is frequently a significant component. The cross-sectional area of the source/drain extensions is determined by the thickness of the fins. Source/drain series resistance may be reduced by raising the source/drain, ex-situ doping of the fin area (excluding the area under the gate) and, in particular, by implanting the entire source and drain regions thereof. However, in order to implant to the deeper depths of the source and drain regions, relatively high implant energies are required. The use of such high implant energies may heavily damage the semiconductor structure of the FinFET, and hence is undesirable. Moreover, the use of higher implant energies requires heavy masking of the channel regions to avoid unwanted implantation into these areas of the device.

Source/drain series resistance may also be reduced through salicidation of source/drain contacts. However, this approach is limited by the surface area available for salicidation, which may be further limited by the presence of spacer structures.

It has now been found that the aforementioned problems may be addressed by reducing the height of the source/drain regions in a semiconductor device. This may be accomplished, for example, through the partial removal of the source/drain regions through etching. Preferably, an anisotropic dry etch is used for this purpose, although an isotropic etch may be used in embodiments where etching into the channel region (and under the spacer structures) is desired, as where it is desirable to increase the penetration of the implant dopant beneath the spacer structures.

Since this methodology results in source/drain regions having reduced heights, these regions may be implanted all the way to the bottom of these regions, and at lower implant energies than would otherwise be the case. After implantation, the vertical and horizontal surfaces of the fins may be salicided. Here, the method is further advantageous in that it increases the surface area available for salicidation, since it exposes additional surface area beneath the spacer for salicidation. Absent this approach, salicidation would only occur on previously exposed surfaces of the gate, and hence in many applications would be limited to the top surface of the gate. This additional salicidation can help to compensate for source/drain series resistance, as well as for the adverse effect on drive current of lower levels of implantation when such lower levels are required due to other considerations.

The methodologies described herein are also advantageous in that they allow the polysilicon gate height to be kept sufficiently high to compensate for spacer overetching. The additional height of the polysilicon is useful during such overetching because it gets etched during the etching of the source/drain regions. Hence, the additional height of polysilicon ensures that a suitable amount of polysilicon remains which extends over the fin. Preferably, the additional height of the polysilicon is equal to the amount that will be removed during source/drain etching.

The devices and methodologies disclosed herein may be further understood with reference to FIGS. 3-8, which depict a particular, non-limiting embodiment of a fabrication process for a FinFET device in accordance with the teachings herein. As shown therein, a semiconductor structure 201 is provided which comprises a dielectric substrate 203 having a fin 205 disposed thereon. The fin 205 extends between source 207 and drain 209 regions (which may be further defined in subsequent process steps) and, upon completion of the FinFET, will contain the channel region of the transistor.

Figure 3:
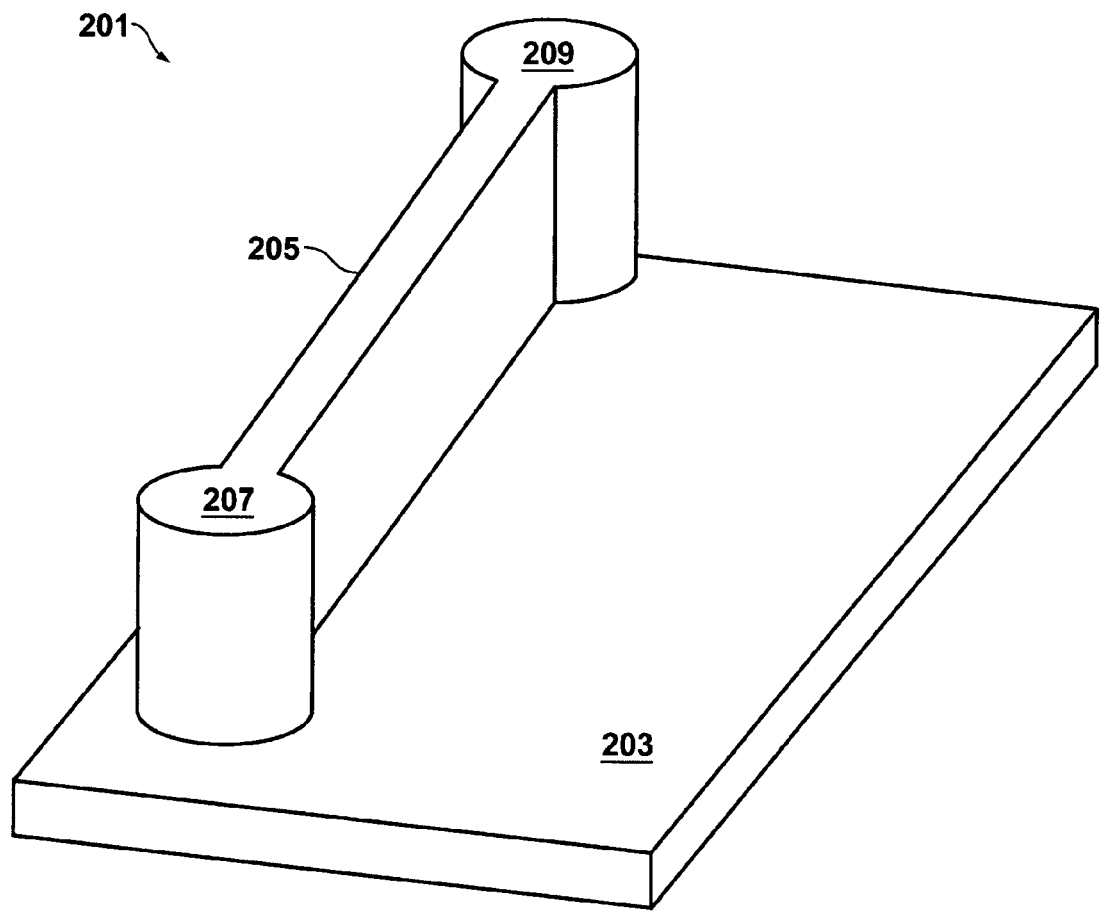
FIG. 3 is an illustration of a step in a process for making a FinFET structure in accordance with the teachings herein.

The semiconductor structure 201 of FIG. 3 may be formed from a semiconductor-on-insulator (SOI) wafer or other suitable substrate. Processes for forming such structures are well known in the art and typically include use of suitable masking and etching processes.

Figure 4:
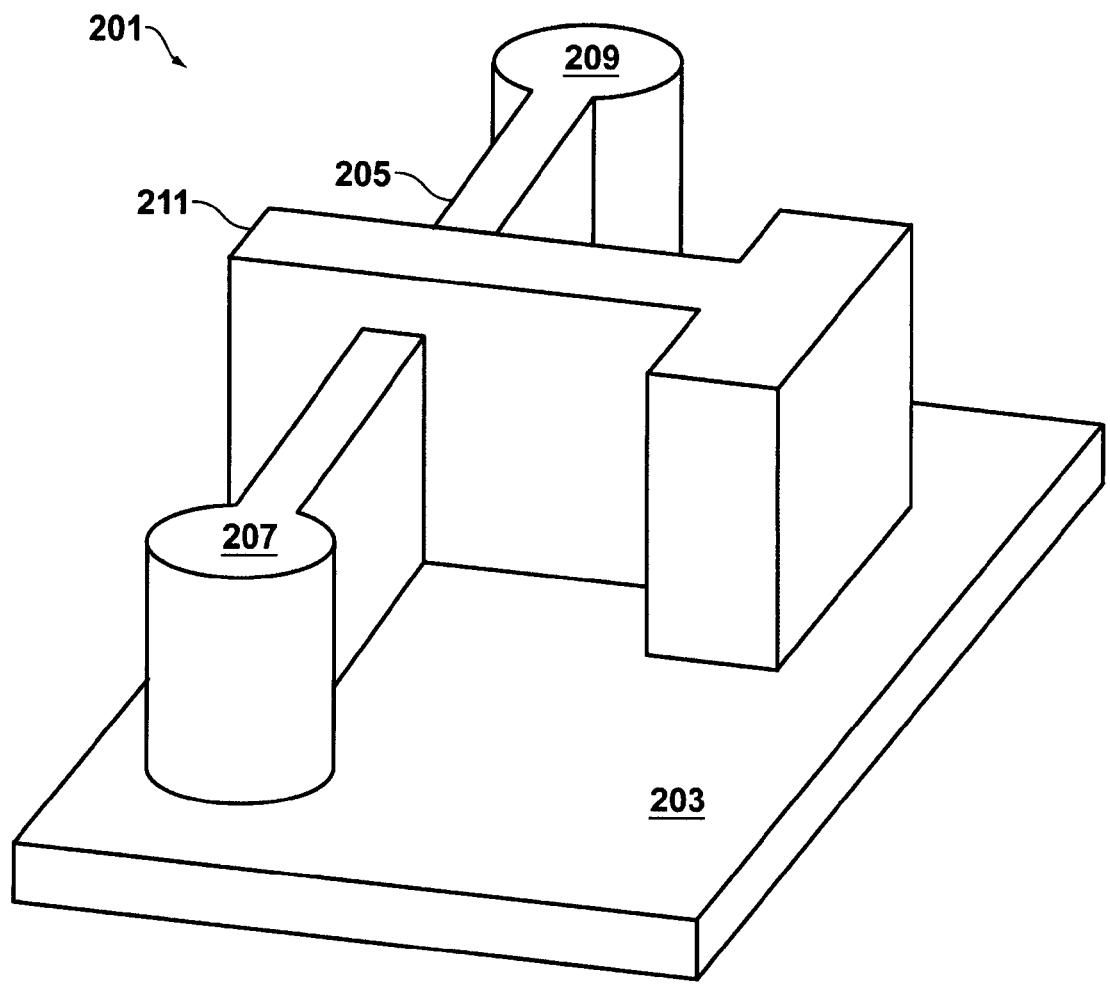
FIG. 4 is an illustration of a step in a process for making a FinFET structure in accordance with the teachings herein.

With reference to FIG. 4, following formation of the fin 205, a gate structure 211 is formed which extends over the fin 205. The gate structure may be formed, for example, by depositing a layer of polysilicon, and exposing the layer of polysilicon to suitable masking and etching processes. Though not shown, a layer of a suitable dielectric material is typically deposited over the fin 205 prior to formation of the gate structure 211, and the exposed portions of the layer of dielectric material are stripped after formation of the gate structure 211. As a result, an insulating layer of dielectric material remains between the gate structure 211 and the fin 205 to provide suitable electrical isolation between them.

Figure 5:
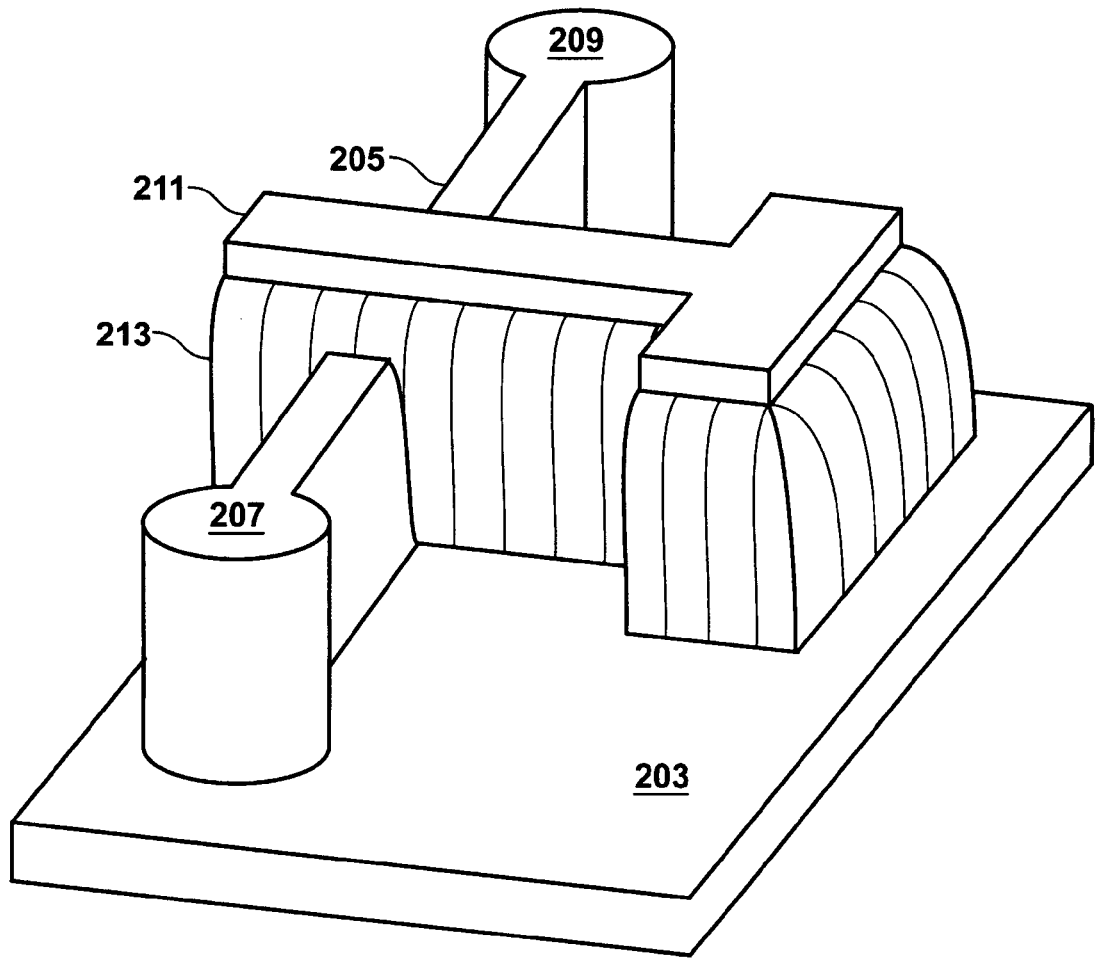
FIG. 5 is an illustration of a step in a process for making a FinFET structure in accordance with the teachings herein.

As shown in FIG. 5, a conformal layer, which preferably comprises silicon nitride, is deposited over the structure. The conformal layer is then subjected to a suitable etch back, preferably with a dry, anisotropic etch, to produce first and second spacer structures 213 on the primary faces of the fin 205.

Figure 6:
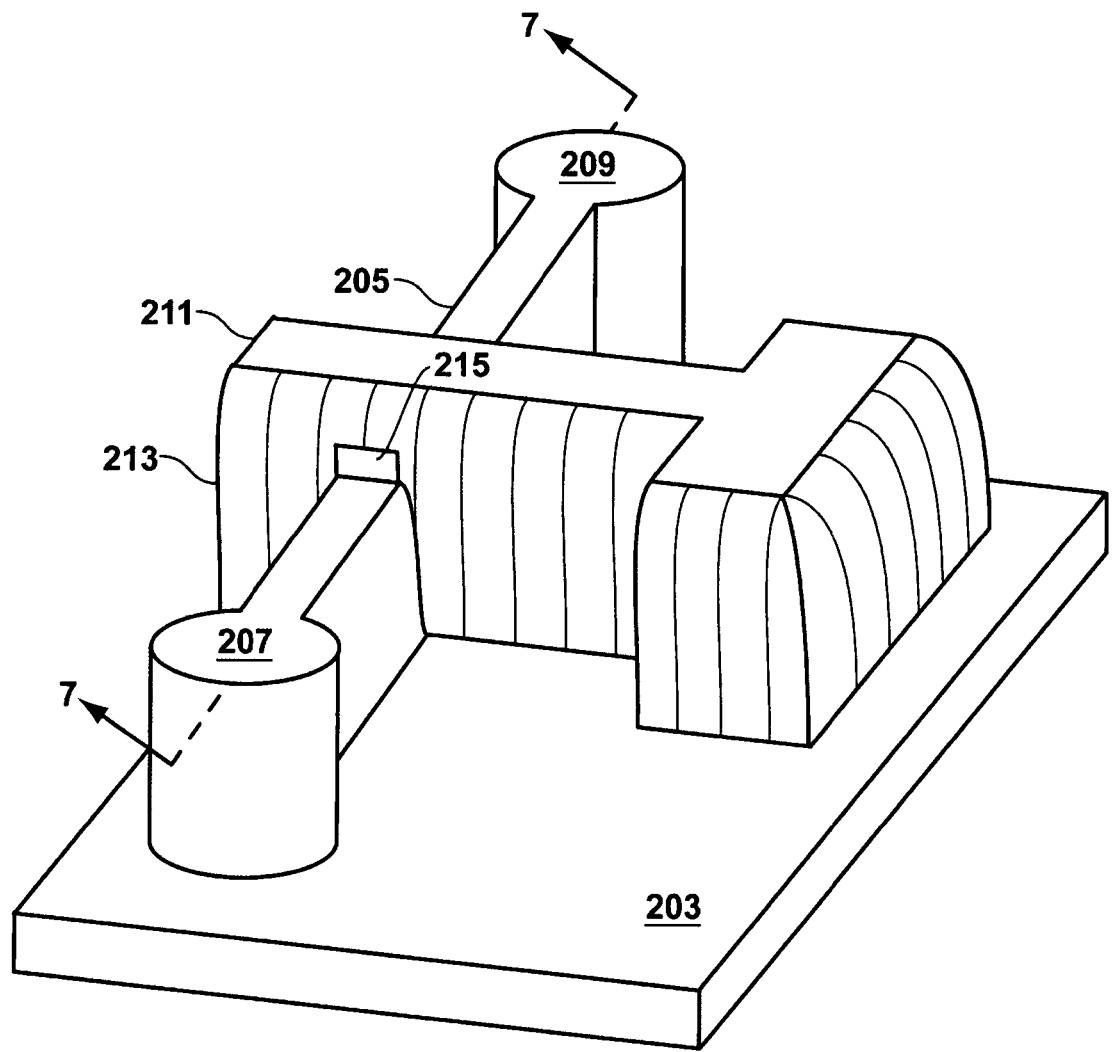
FIG. 6 is an illustration of a step in a process for making a FinFET structure in accordance with the teachings herein.

Referring now to FIG. 6, the structure is then subjected to a suitable etch to reduce the height of the source 207 and drain 209 regions. This etch also has the effect of reducing the height of the fin 205, thus opening up an additional vertical region 215 on each major face of the fin 205 where the material of the gate 211 is exposed.

Figure 7:
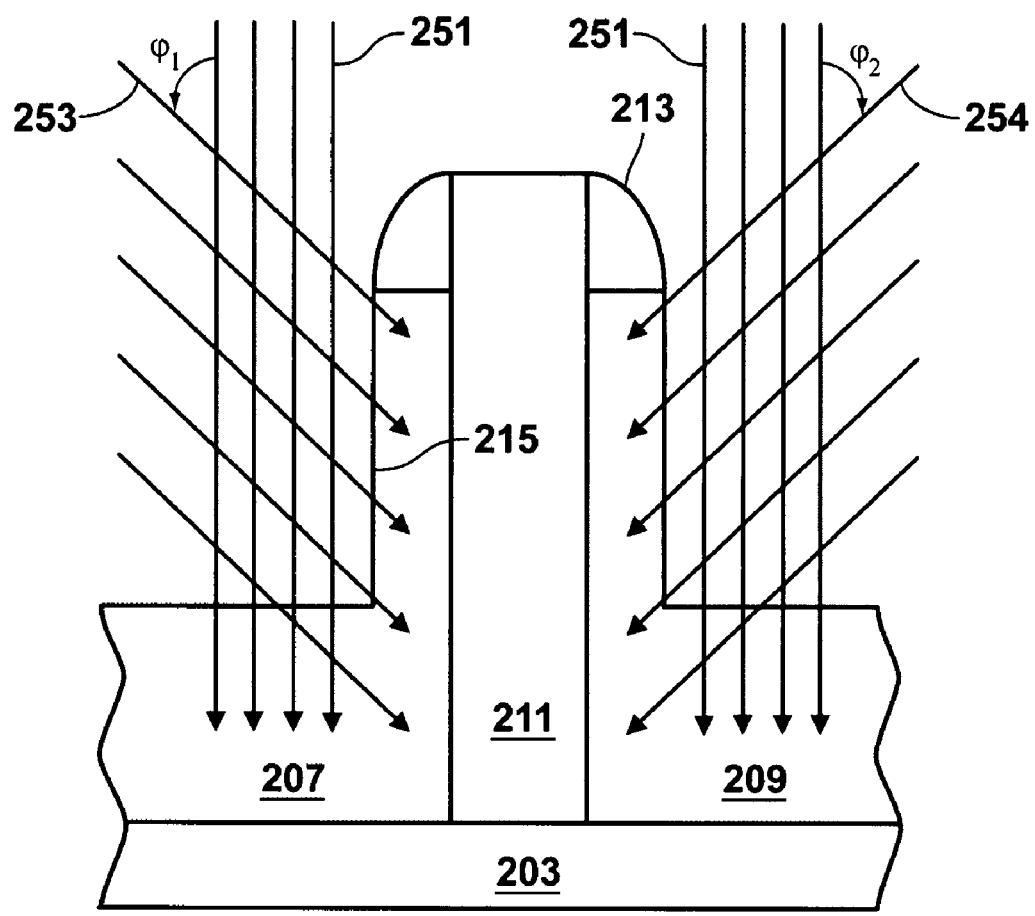
FIG. 7 is a partial cross-sectional view taken along LINE 7-7 of FIG. 6, and is an illustration of a step in a process for making a FinFET structure in accordance with the teachings herein.

As shown in FIG. 7, the structure is then subjected to an implantation 251 to define the source 207 and drain 209 regions of the device, and is subjected to first 253 and second 254 angular implantations (at first and second angles $\phi_1$ and $\phi_2$, respectively, which may be the same or different) into the additional regions 215 on the first and second respective major surfaces of the fin 205. Typically, $|\phi_1|$ and $|\phi_2|$ are within the range of about 20° to about 70° as measured with respect to an axis which is perpendicular to the substrate 203. Preferably, $|\phi_1|$ and $|\phi_2|$ are within the range of about 30° to about 60°, more preferably, $|\phi_1|$ and $|\phi_2|$ are within the range of about 40° to about 50°, and most preferably, $|\phi_1|$ and $|\phi_2|$ are about 45°.

The presence of additional exposed regions 215 allows the angled implant to implant into the extension regions of the device irrespective of fin pitch, and hence reduce source/drain extension resistance and, therefore, parasitic series resistance. Various dopants may be used for the angled implants including, but not limited to, such dopants as Si, Ge, Sb, In, As, P, $BF_2$, Xe or Ar. The dopants used for the angled implant may be the same or different.

Figure 8:
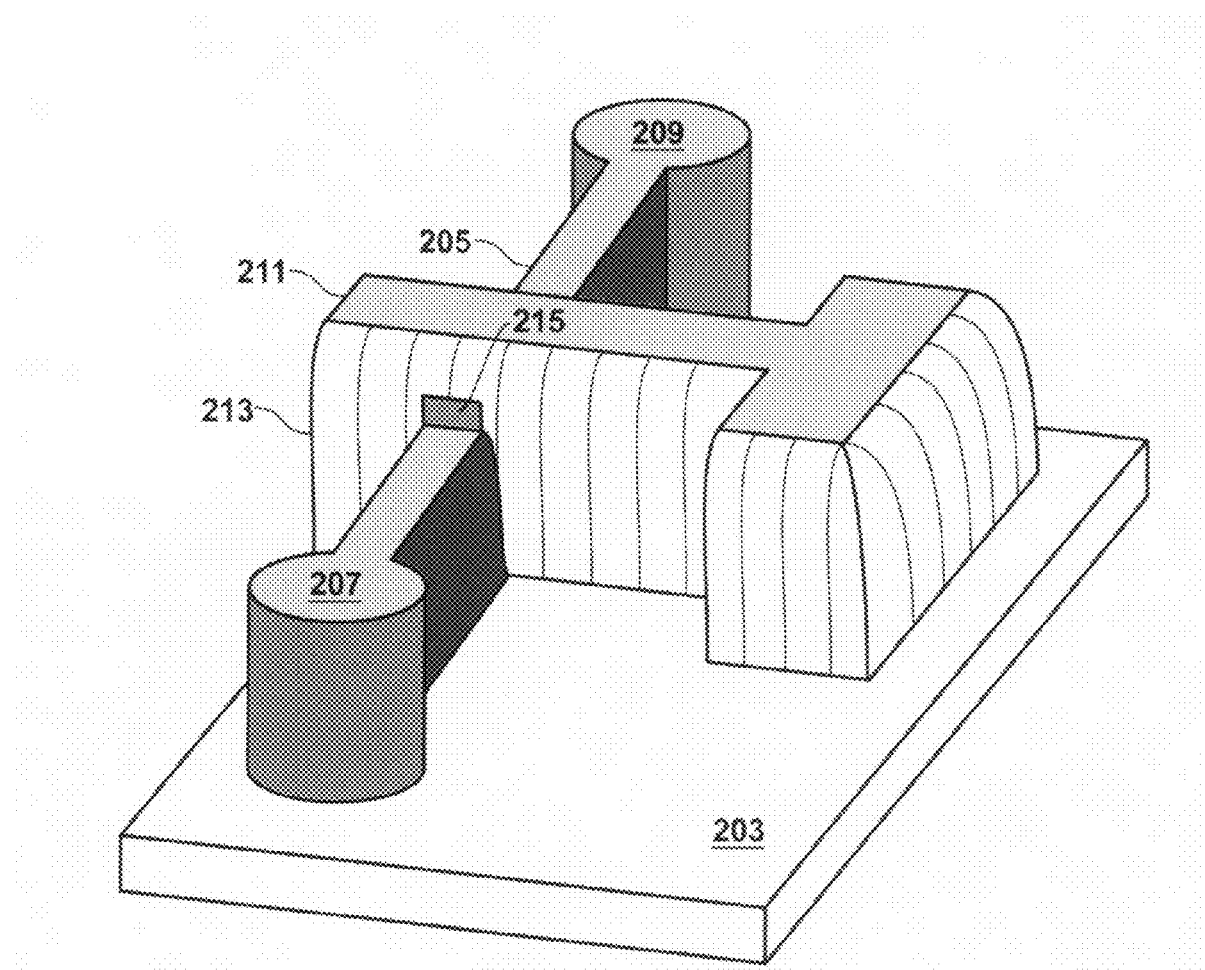
FIG. 8 is an illustration of a step in a process for making a FinFET structure in accordance with the teachings herein.

With reference to FIG. 8, the structure is then subjected to salicidation. This results in the formation of a layer of metal silicide over the exposed surfaces of the source 207, drain 209 and gate structure 211, and also results in salicidation of the additional region 215 on one or both major surfaces of the fin 205.

The foregoing process has some notable advantages. First of all, the etch depicted in FIG. 4 has the effect of reducing the height of the fin 205 and the source 207 and drain 209 regions. Consequently, the source 205 and drain 207 regions may be implanted to a greater depth, and with a greater dopant concentration, than would be the case if the source 207 and drain 209 regions were taller. Also, lower implant energies may be utilized during the implant process, which results in less damage to the structure.

Figure 9:
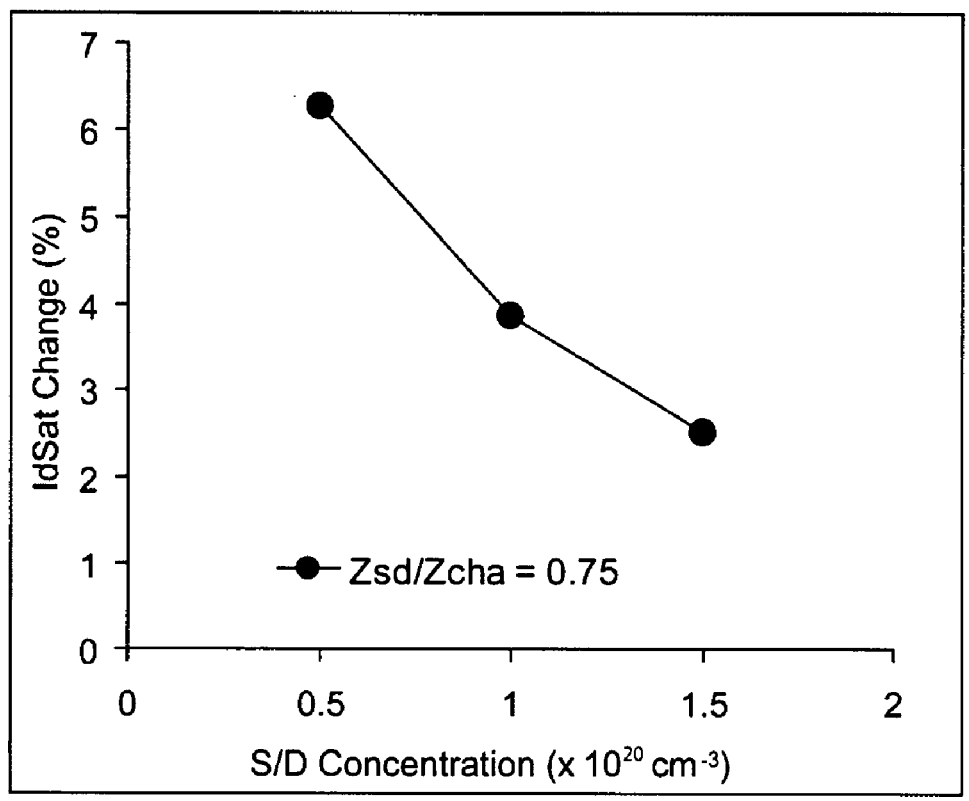
FIG. 9 is a graph of percent change in drive current ($I_{dSat}$) as a function of source/drain dopant concentration (in $1 \times 10^{20}$ $cm^{-3}$)

The advantage of greater dopant concentration in the source 207 and drain 209 regions of the device afforded by the methodology of FIGS. 3-8 may be appreciated with respect to FIG. 9, which is a graph of the percent change in drive current ($I_{dSat}$) as a function of the concentration of dopant (in $10^{20}$ cm$^{-3}$) in the source/drain regions. As seen therein, drive current drops significantly with an increase in dopant concentration.

A further advantage of the process depicted in FIGS. 3-8 is that the opening of additional regions 215 as a result of fin 205 etching increases the total surface area available for salicidation. The additional salicidation available by the opening of such regions may be used to compensate for adverse effects on drive current and for parasitic series resistance. For example, in some applications, lower than optimal levels of doping may be utilized in the source 207 and drain 209 regions during the fabrication of the FinFET device. This may be due to the need to minimize structure damage by avoiding the use of higher implant energies, which results in lower dopant levels at greater depths. Lower doping levels may also be required to minimize adverse consequences which can result from doping the adjacent portions of the fin 205. Such adverse consequences may also include parasitic capacitances attendant to the uneven doping of the fin which may accompany doping of the adjacent source 207 and drain 209 regions.

The process depicted in FIGS. 3-8 is further advantageous in that it provides a means by which a suitable height of the gate 211 above the fin 205 may be maintained in applications in which overetching of the first and second spacer structures 213 is desirable. In such applications, the additional height of the gate structure 211 is useful during the overetching because it gets etched during the etching of the source/drain regions. Hence, the additional height of polysilicon ensures that a suitable amount of polysilicon remains which extends over the fin. Preferably, the additional height of the polysilicon is equal to the amount that will be removed during etching of the source 207 and drain 209 regions.

Figure 10:
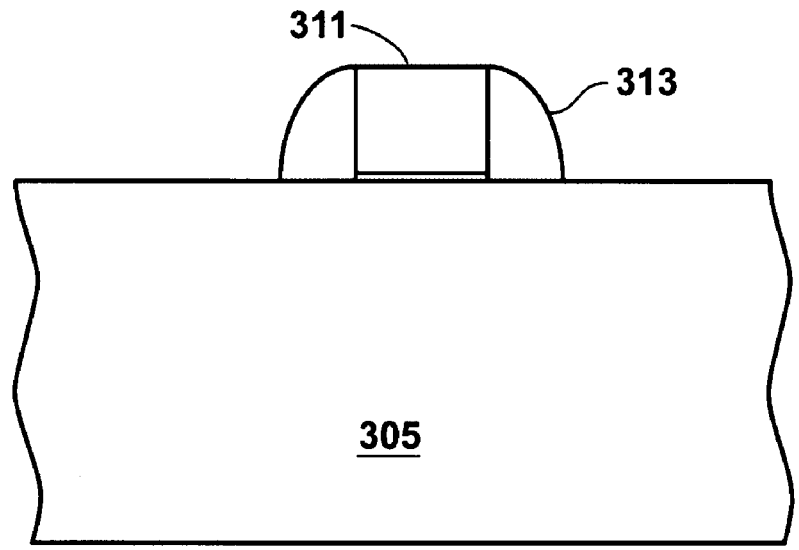
FIG. 10 is an illustration of a step in a process for making a bulk semiconductor device in accordance with the teachings herein.
Figure 11:
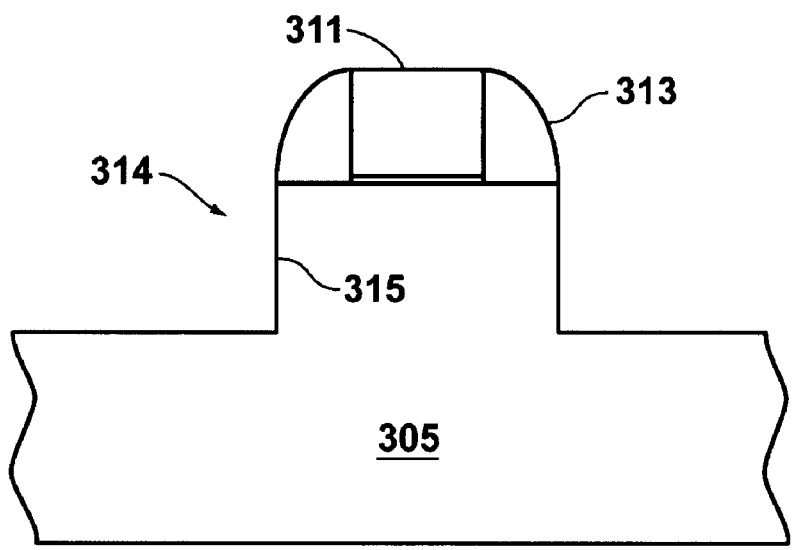
FIG. 11 is an illustration of a step in a process for making a bulk semiconductor device in accordance with the teachings herein.
Figure 12:
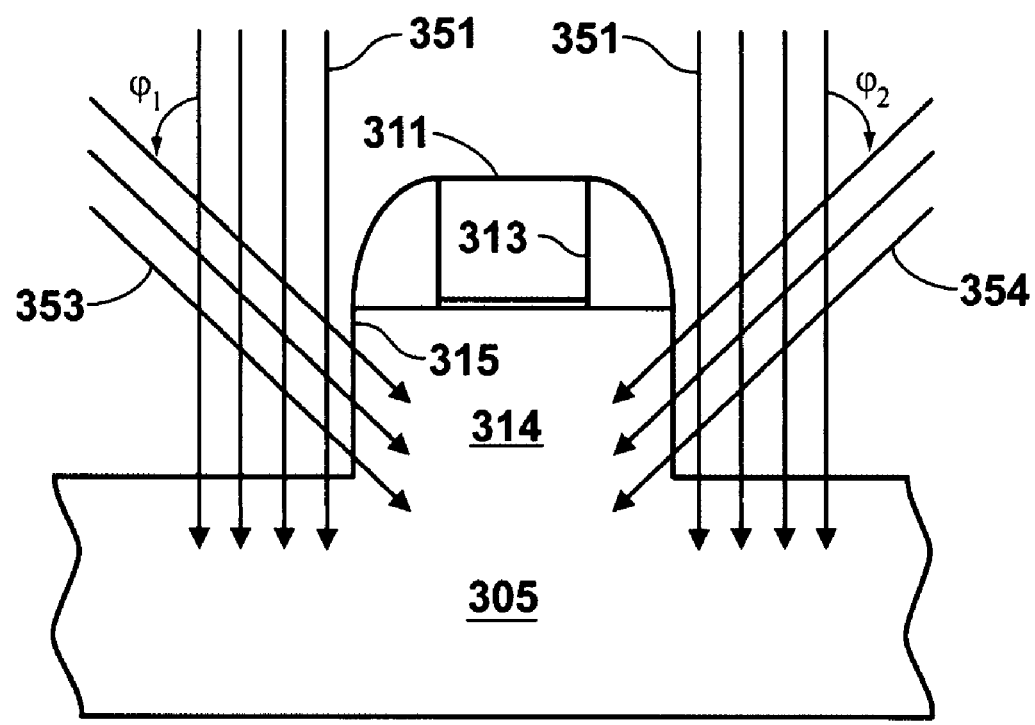
FIG. 12 is an illustration of a step in a process for making a bulk semiconductor device in accordance with the teachings herein.

FIGS. 10-12 illustrate a particular, non-limiting embodiment of an application of the methodologies taught herein to the fabrication of bulk semiconductor devices. With reference to FIG. 10, a structure is depicted which comprises a bulk semiconductor substrate 305 upon which is defined a gate 311. The gate 311 has first and second spacer structures 313 defined adjacent thereto.

With reference to FIG. 11, the structure is subjected to a suitable etch to remove a portion of the substrate 305 adjacent to the first and second spacer structures 313. This etch exposes a portion of the substrate 305 which underlies the spacer structure, and hence creates a mesa structure 314 which has vertical surfaces 315 and which contains the channel region of the device.

As shown in FIG. 12, the substrate 305 is then subjected to an implant to define the source and drain regions of the device (or portions thereof). In addition, the mesa structure 314 (and in particular, the portion of the substrate 305 beneath the spacer structures which is contained therein and which has been exposed by the etch) is further subjected to first 353 and second 354 tilted implants at first and second angles $\phi_1$ and $\phi_2$, respectively. The angles and dopants used in these implants may be the same or different, and may include any of those mentioned in reference to the previously described embodiments. As with the previously described embodiments, this embodiment is advantageous in that it permits a greater dopant concentration to be achieved in the channel region of the device than would be the case without formation of the mesa structure 314. In addition, this approach also permits the use of lower implant energies during the implant process, which results in less damage to the structure.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

The terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the disclosure herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a semiconductor device, comprising:
    providing a FinFET structure comprising (a) raised source and drain regions, a fin extending between the source and drain regions and containing a channel region, and (c) a gate extending over the channel region;
    etching the FinFET structure such that the height of at least a portion of the fin is reduced and a vertical portion of the fin is exposed;
    implanting the source and drain regions at an angle; and
    saliciding the exposed vertical portion of the fin;
    wherein the FinFET structure has at least one spacer structure disposed adjacent to said gate, and wherein etching the FinFET structure exposes a portion of the fin which underlies the at least one spacer structure.

2. The method of claim 1, wherein the step of saliciding the exposed vertical portion of the fin involves saliciding both horizontal and vertical surfaces of the fin.

3. The method of claim 1, wherein the step of etching the FinFET structure utilizes an anisotropic etch.

4. The method of claim 1, wherein the step of etching the FinFET structure creates a vertical surface in the fin adjacent to the gate, and wherein the vertical surface is salicided.

5. The method of claim 1, wherein the source and drain regions are implanted at an angle $\phi_1$, and wherein $|\phi_1|$, as measured from an axis perpendicular to the semiconductor layer, is within the range of about 20° to about 70°.

6. The method of claim 5, wherein $|\phi_1|$, as measured from an axis perpendicular to the semiconductor layer, is within the range of about 30° to about 60°.

7. The method of claim 5, wherein $|\phi_1|$, as measured from an axis perpendicular to the semiconductor layer, is within the range of about 40° to about 50°.

8. The method of claim 1, further comprising:
    subjecting the exposed portion of the fin to an angled implant.

9. The method of claim 8, wherein subjecting the exposed portion of the fin to an angled implant occurs prior to etching the FinFET structure.

10. The method of claim 8, wherein subjecting the exposed portion of the semiconductor structure to an angled implant occurs after etching the FinFET structure.

11. The method of claim 1, wherein the gate has first and second spacer structures disposed adjacent thereto, and wherein etching the FinFET structure results in the removal of a portion of the fin adjacent to the first and second spacer structures.

12. The method of claim 11, wherein the exposed portion of the fin adjacent to the first spacer structure is subjected to a first angled implant, and wherein the exposed portion of the fin adjacent to the second spacer structure is subjected to a second angled implant.

13. The method of claim 12, wherein the first angled implant involves implanting the portion of the fin which underlies the first spacer structure with a first species at an angle $\phi_1$ and wherein $|\phi_1|$, as measured from an axis perpendicular to the semiconductor layer, is within the range of about 20° to about 70°.

14. The method of claim 13, wherein $|\phi_1|$, as measured from an axis perpendicular to the semiconductor layer, is within the range of about 30° to about 60°.

15. The method of claim 13, wherein the second angled implant involves implanting the portion of the fin which underlies the second spacer structure with a second species at an angle $|\phi_2|$, and wherein $|\phi_2|$, as measured from an axis perpendicular to the semiconductor layer, is within the range of about 20° to about 70°.

16. The method of claim 15, wherein the first and second species are distinct.

17. The method of claim 15, wherein the first and second species are selected from the group consisting of Si, Ge, Sb, In, As, P, $BF_2$, Xe and Ar.

18. The method of claim 1, wherein said gate in said FinFET is essentially perpendicular to said fin.

* * * * *